(12) United States Patent
Walker et al.

(10) Patent No.: US 8,991,117 B1
(45) Date of Patent: Mar. 31, 2015

(54) SOLAR AND RAINWATER TOWER

(71) Applicants: Dorothy M. Walker, Belle Glade, FL (US); Stanley Mach, Riviera Beach, FL (US)

(72) Inventors: Dorothy M. Walker, Belle Glade, FL (US); Stanley Mach, Riviera Beach, FL (US)

(73) Assignee: Solur Terra, Inc., Belle Glade, FL (US)

( * ) Notice: Subject to any disclaimer, the term of this patent is extended or adjusted under 35 U.S.C. 154(b) by 0 days.

(21) Appl. No.: 14/270,040

(22) Filed: May 5, 2014

(51) Int. Cl.
| | |
|---|---|
| *E04H 6/02* | (2006.01) |
| *H01L 31/048* | (2014.01) |
| *H01L 31/052* | (2014.01) |
| *E04H 6/00* | (2006.01) |
| *F24J 2/52* | (2006.01) |
| *E04D 13/00* | (2006.01) |

(52) U.S. Cl.
CPC .......... *H01L 31/0482* (2013.01); *H01L 31/052* (2013.01); *E04H 6/00* (2013.01); *F24J 2/5245* (2013.01); *E04D 13/00* (2013.01)
USPC ................................ 52/173.3; 52/74; 136/251

(58) Field of Classification Search
CPC ................................ Y02E 10/50; E04H 6/025
USPC ....................... 52/73, 74, 173.3; 136/246, 251
See application file for complete search history.

(56) References Cited

U.S. PATENT DOCUMENTS

| | | | | |
|---|---|---|---|---|
| 4,611,090 | A | * | 9/1986 | Catella et al. ................. 136/251 |
| 8,013,569 | B2 | * | 9/2011 | Hartman ....................... 320/109 |
| D657,735 | S | * | 4/2012 | Mackler ....................... D13/102 |
| 8,375,655 | B1 | * | 2/2013 | Welschholz .................. 52/173.3 |
| 8,471,141 | B2 | * | 6/2013 | Stancel et al. ................ 136/246 |
| 8,511,007 | B2 | * | 8/2013 | Powers, III .................. 52/173.3 |
| 8,607,512 | B2 | * | 12/2013 | Batut et al. ................... 52/173.3 |
| 8,640,394 | B2 | * | 2/2014 | Richardson ...................... 52/73 |
| 2014/0196387 | A1 | * | 7/2014 | Neito et al. .................. 52/173.3 |

* cited by examiner

*Primary Examiner* — Jeanette E Chapman
*Assistant Examiner* — Daniel Kenny
(74) *Attorney, Agent, or Firm* — Gold & Rizvi, P.A.; Glenn E. Gold

(57) ABSTRACT

A modular tower assembly particularly suited for deployment in a parking lot area for collecting solar energy and precipitation includes left-hand and right-hand support modules, each having a base and a support pedestal having a bottom affixed to one end of the base. A solar panel mount has one end affixed to a pedestal top and cantilevered over the base. The left-hand support module pedestal is joined to the right hand support module pedestal such that the base of the left-hand module extends oppositely from the base of the right-hand module. A solar panel assembly is affixed to each of solar panel mounts. The modular assembly is particularly well-adapted for large scale collection of solar power for subsequent conversion to electrical power directly connected to a local power grid. Each tower is further adapted for the collection of fresh water from natural precipitation.

17 Claims, 14 Drawing Sheets

US 8,991,117 B1

SOLAR AND RAINWATER TOWER

FIELD OF THE INVENTION

The present disclosure generally relates to parking lot solar power collecting structures. More specifically, the present invention pertains to highly-adaptable expandable interlocking tower modules providing vehicle covering, solar energy collection and rainwater collection.

BACKGROUND OF THE INVENTION

As the worldwide energy consumption continues to grow, there has been a growing emphasis on the development of alternative energy sources. By 2050, it is estimated that one-third of the world's energy will come from solar, wind and other renewable energy sources. Climate change, population growth, and fossil fuel depletion mean that renewables will need to play a bigger role in the future than they do today. From an environmental perspective, solar power is the best thing going. A 1.5 kilowatt photovoltaic (PV) system will keep more than 110,000 pounds of carbon dioxide, the chief greenhouse gas, out of the atmosphere over the next 25 years. The same solar system will also prevent the need to burn 60,000 pounds of coal. With solar, there is not acid rain, no urban smog or pollution of any kind.

The growth of the solar power industry has been spurred recently by economic and tax incentives encouraging the use of alternatives to fossil fuels, lower cost photovoltaic (PV) panels and mounting systems, and greater availability of investment capital. Innovations in the design, engineering, and construction of large-scale PV systems have also tipped the balance in favor of going solar. One area where there has been much attention focused has been parking lots, which take up a substantial area of underutilized space. The solar power industry has attempted to put increasing amounts of that underutilized space to productive use; however, conventional attempts to mount solar panels on traditional parking lot structures fail to address the need to generate electrical power on a much larger commercial scale.

During the last few decades, the environmental impact of the petroleum-based transportation infrastructure along with increased cost of petroleum-based fuels has led to renewed interest in an electric transportation infrastructure. Electrically powered vehicles differ from fossil fuel-powered vehicles in that the electricity they consume can be generated from a wide range of sources, including fossil fuels, nuclear power, and renewable sources such as solar power, and wind power or any combination thereof. The electricity can be stored on board the vehicle using a battery, flywheel, or super capacitors. The primary means of storage on the vehicle are on-board rechargeable electric batteries. While a certain amount of electricity can be generated from excess kinetic energy during movement of the vehicle, the batteries are typically recharged while the vehicle is stationary and connected to a charging station.

Electric vehicle charging stations are elements in an infrastructure that supply electric energy for the recharging of plug-in electric vehicles, such as all-electric cars and plug-in hybrids. As plug-in hybrid electric vehicle and battery powered electric vehicle ownership expands, there is a growing need for widely distributed publicly accessible charging stations. While many charging stations are on-street facilities provided by electric utility companies, mobile charging stations have also been recently introduced. Some of the special charging stations provide one or a range of heavy-duty or special connectors or charging without a physical connection using parking places equipped with inductive charging mats.

However, current charging stations are typically powered by the existing electrical grid. As the popularity and use of electric vehicles increases, the demands on the electric grid will likewise also increase. Since the majority of electricity generated by the grid derives its source from fossil fuels, the energy derived therefrom also contributes pollutants to the atmosphere. Therefore, an electric vehicle charging station is needed wherein the electrical energy for charging the vehicle is derived from solar energy and preferably by a dedicated solar array. Unfortunately, the availability of electrical power for recharging vehicles while parked in a typical parking lot is very scarce.

In addition to the need for developing alternative energy sources, there is an ever-increasing need to address water scarcity, which has already affected every continent. Approximately 1.2 billion people, or almost one-fifth of the world's population, live in areas of physical scarcity, and an additional 500 million or so people are approaching this situation. Another 1.6 billing people, or almost one-fourth of the world's population, face economic water shortage (i.e., lacking the necessary infrastructure to take water from rivers and aquifers. Water scarcity is among the main problems to be faced by many societies in the $21^{st}$ century. Water use has been growing at more than twice the rate of population increase in the last century. Accordingly, similar to the need for developing renewable energy sources, there has been an increasing awareness and focus on developing means for harvesting water from rain and related precipitation. One common method of rainwater collection involves rooftop precipitation collection.

Accordingly, it would be highly desirable to develop a structural system that provides the benefits of a solar-collecting parking lot structures, but on a much broader scale, thereby addressing the power-generation limitations of existing structures. There is a crucial as of yet unmet need for such a structural system that could be easily and efficiently deployed atop the surface of a parking lot, yet in a manner that would not render the structure susceptible to damage from heavy winds (e.g., by utilizing a novel tower structure that is completely free of a conventional vertical sidewall design).

It would be even more desirable to provide such a modular system configured such that the collected solar energy power could be converted to useful electrical power easily transferred to a large-scale electrical power grid, while also providing the user with the option of using some of the collected solar energy to recharge electrically-powered vehicles parked beneath such a parking lot structure. Finally, it would be preferable that the system doubles as a means for conveniently collecting and storing potable water from weather precipitation.

The present invention provides a system that successfully addresses all of the aforementioned, previously unresolved, issues by way of a unique interlocking modular structure, particularly adapted for efficient and effective deployment upon a parking lot ground surface.

SUMMARY OF THE INVENTION

In an implementation of the invention, a portable interlocking solar energy and precipitation collection module assembly is provided which comprises:
    a left-hand support module, comprising:
        a vertically-oriented pedestal portion having an upper end, a lower end, a left-facing surface and an opposite right-facing surface, the right-facing surface having at least one interlocking pin extending outwardly therefrom and a keyed interlock aperture extending therethrough;

a horizontally-oriented support foot having an upper surface, a lower surface, a proximal end portion and a distal end, the pedestal portion lower end transitioning into said proximal end of said support foot;

a solar panel mounting and precipitation collection portion having a periphery surrounding a concave upper surface, the concave upper surface having a precipitation drainage aperture extending therethrough, the pedestal portion upper end transitioning into said solar panel mounting and precipitation collection portion, the solar panel mounting and precipitation collection portion extending outwardly in a cantilevered manner over the support foot;

a solar panel assembly mounted atop the support module solar panel mounting and precipitation collection portion; and a right-hand support module, comprising:

a vertically-oriented pedestal portion having an upper end, a lower end, a left-facing surface and an opposite right-facing surface, the left-facing surface having at least one interlocking pin-receiving aperture sized and shaped for engagement with the corresponding at least one interlocking pin of said left-hand support module, and a keyed interlock aperture extending therethrough;

a horizontally-oriented support foot having an upper surface, a lower surface, a proximal end portion and a distal end, the pedestal portion lower end transitioning into the proximal end portion of the support foot;

a solar panel mounting and precipitation collection portion having a periphery surrounding a concave upper surface, the concave upper surface having a precipitation drainage aperture extending therethrough, the pedestal portion upper end transitioning into the solar panel mounting and precipitation collection portion, the solar panel mounting and precipitation collection portion extending outwardly in a cantilevered manner over the support foot; and a solar panel assembly mounted atop the support module solar panel mounting and precipitation collection portion.

In one general aspect, each solar panel mounting surface is provided having a concave surface contour including a central drainage aperture through which water from rain, snow and related states of weather precipitation can be conveniently collected and stored within the module, uncontaminated by the ground, for future consumption.

In another general aspect, the modular configuration is adapted to be easily and efficiently electrically connected to an adjacent power grid in order to selectively transfer collected and stored power to a local power grid.

In another aspect, each modular unit has a unique free-standing construction, absent any vertical walls, which includes a single thin profile support leg supported upon the underlying ground surface. This unique configuration tends to provide minimal resistance to high airflow; thereby, minimizing the likelihood for structural damage during high-wind weather events.

In another aspect, the wall-less modular unit configuration increases the space beneath the support upper platform portion of the structure, thereby facilitating vehicle maneuverability and supporting improved traffic mobility about the erected structures.

In another aspect, the interlocking modular structure includes a tongue positioned along an edge flanking the support pedestal, and further includes a receiver defining a groove in an opposite edge thereof. The groove is configured to receive a tongue of a like-configured solar panel mount portion of an adjacent interlocking module.

In another aspect, each interlocking modular unit includes a mounting frame affixed to the solar panel mount of each support module. Further, the solar panel assembly includes a solar array pivotally affixed to the mounting frame.

In another aspect, the solar array is selectively pivotal to an angular orientation between a horizontal orientation and a vertical orientation.

In another aspect, the pedestal of the left-hand support module includes at least one fixed interlock pin extending oppositely from the base and is intermediate to the pedestal top and the pedestal bottom. The pedestal of the right-hand support module defines a hole therein receiving the at least one fixed interlock pin for aligning the left-hand and the right-handle support modules one to the other.

In another aspect, the left-hand pedestal and the right-hand pedestal each define an interlock hole, or aperture, one in alignment with the other. The interlock holes further define a key slot therein. And interlock pin extends through the interlock holes wherein the interlock pin has a key at the end opposite a head thereof for engaging one of the pedestals for locking the left-hand pedestal to the right-hand pedestal.

In still another implementation, a solar power and precipitation collection modular assembly includes a first support module and a second like-configured support module, wherein each support module has a base and a support pedestal having a bottom thereof affixed to one end of the base. Each modular unit is sized to receive a motor vehicle thereunder and has one end thereof affixed to a top of the pedestal extending, in cantilever fashion, over the base. The modular unit further includes a tongue positioned along an edge flanking pedestal and further includes a receiver at an opposite edge thereof wherein the receiver defines a groove therein parallel to the tongue. A solar panel assembly is affixed to each of the first and second modular units. A charging interface is positioned at each of the first and second modular units for connecting to a vehicle to be charged therefrom. The tongue of the solar panel mount of the first support module is received in the groove of the solar panel mount of the second support module thereby fixing the first support module to the second support module.

In another aspect, the tongue of the solar panel mount of the first support module and the receiver of the second support module define an interlock hole, or aperture, therethrough and further include an interlock pin engaged in the interlock aperture to secure the tongue in the groove.

In another aspect, each solar panel assembly includes a mounting frame affixed to the solar panel mount of each support module. Further, the solar panel assembly includes a solar array pivotally affixed to the mounting frame.

In still another aspect, the solar array is selectively pivotal to an angular orientation between a horizontal orientation and a vertical orientation.

In another aspect, each support module has a base and the support pedestal having a bottom thereof affixed to one end of the base. A solar panel mount has one end thereof affixed to a top of the pedestal and is cantilevered over the base. The left-hand support module and the right-hand support module are separated one from the other and oriented such that a free cantilevered end of each solar panel mount are facing one to the other. A solar panel bridge has one end thereof affixed to the free cantilevered end of the left-handle support module and an opposite end thereof affixed to the free cantilevered end of the right-handle support module. The solar panel bridge further includes at least one solar array mounted to a top thereof. A solar panel assembly is affixed to each of the solar panel mounts of the left-hand and the right-hand support module. A charging interface is interconnected to the solar panel assemblies and the solar panel bridge, and at least one charging interface is located at each of the left-hand and the right-hand support modules for connecting to a vehicle to be charged therefrom.

In a still further aspect, a tongue is positioned along a first edge extending along the left-hand support module, the solar panel bridge, and the right-handle support module. Further, a receiver is positioned along an opposite edge thereof and defines a groove therein.

These and other features, aspects, and advantages of the invention will be further understood and appreciated by those skilled in the art by reference to the following written specification, claims and appended drawings.

BRIEF DESCRIPTION OF THE DRAWINGS

The invention will now be described, by way of example, with reference to the accompanying drawings, where like numerals denote like elements and in which.

Like reference numerals refer to like parts throughout the various views of the drawings.

DETAILED DESCRIPTION OF THE INVENTION

Figure 1:
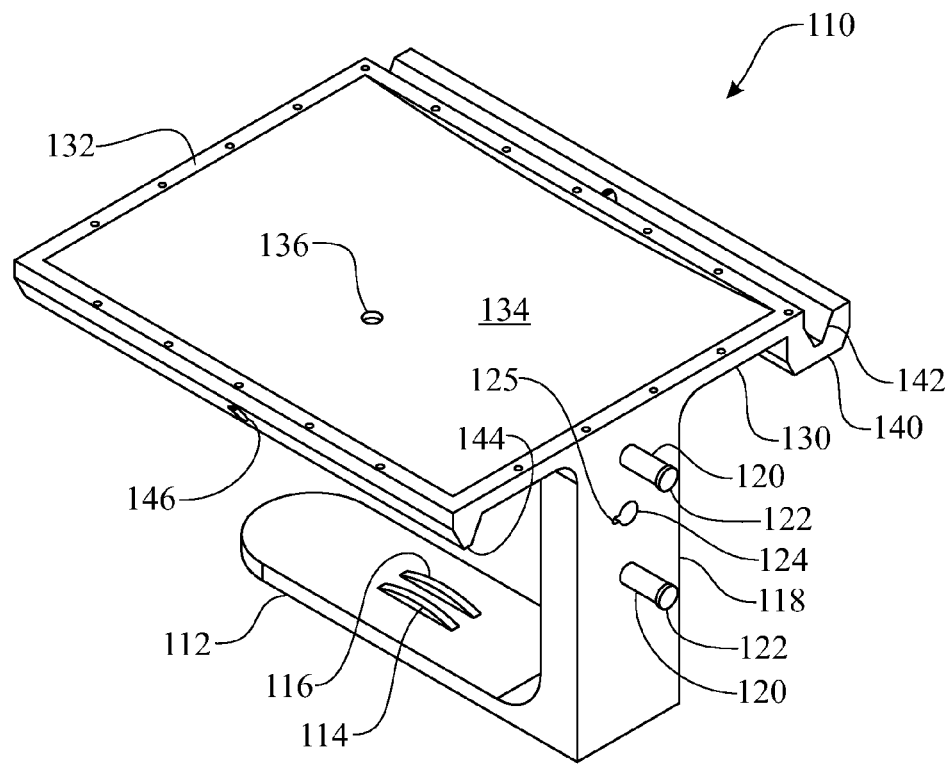
FIG. 1 presents a top rear perspective view of a left-hand module of a portable interlocking solar energy and precipitation collection tower assembly in accordance with an implementation of the present invention.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Referring now generally to FIGS. 1-16, the structural innovation of the present invention will enable the solar power industry to put increasing amounts of underutilized space to use. Vast swaths of asphalt nationwide can be covered by modular towers fitted with photovoltaic panels that generate electricity—while also providing shade for parked vehicles. The tower modules can be used to easily cover virtually any desired area of the parking lot. They create very little resistance to wind, thereby creating integral stability even under windy weather conditions. They convert parking lots into solar power plants. A further benefit of the modular towers of the present invention is that they are adapted for collecting clean water from natural precipitation, such as from rainwater.

Grid-connected photovoltaic power systems are power systems energized by photovoltaic (PV) panels that are connected to the utility grid. Grid-connected PV power systems consist of PV panels, Maximum Power Point Tracking (MPPT), solar inverters, power conditioning units and grid connection equipment. Photovoltaic (PV) modules are a packaged, connected assembly of solar cells, which are electrically connected and mounted on a supporting structure to create a solar panel. When conditions are right, the grid-connected PV system supplies excess power, beyond consumption by the connected load, to the utility grid. Solar energy gathered by PV solar panels, intended for delivery to a power grid, must be conditioned, or processed for use, by a grid-connected inverter. The inverter sits between the solar array and the grid, draws energy from each, and may be a large stand-alone unit or may be a collection of small inverters, each physically attached to individual solar panels.

Figure 2:
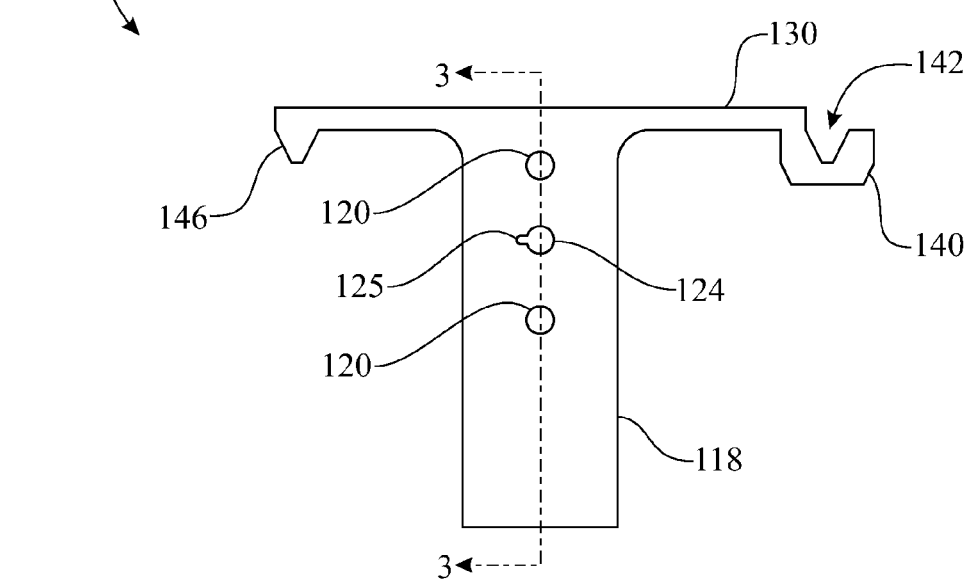
FIG. 2 presents a rear elevation view of the left-hand tower module of FIG. 1.
Figure 3:
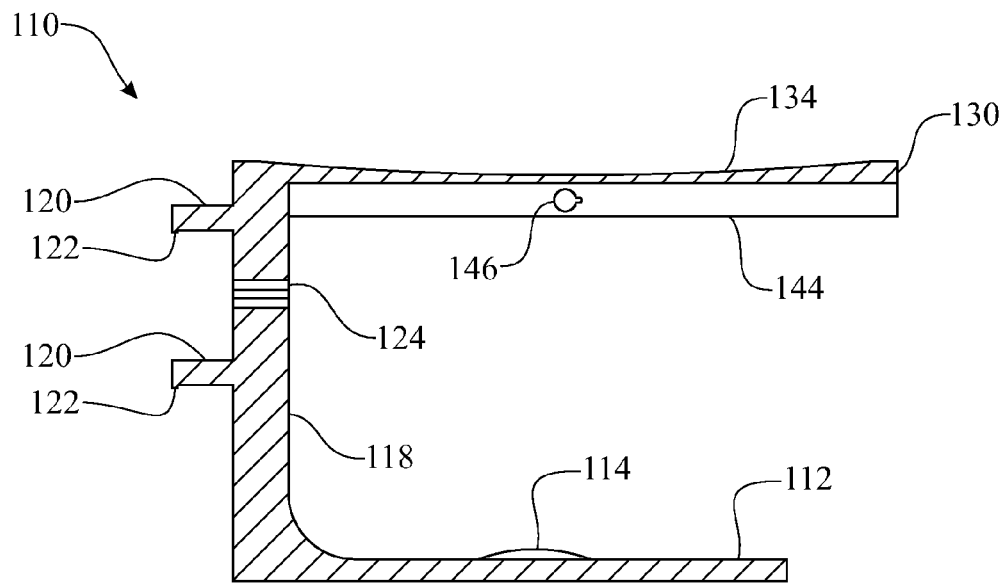
FIG. 3 presents a cross-sectional view of the left-hand tower module taken along section line 3-3 of FIG. 2.

Referring now to FIGS. 1-16, the present invention is directed to solar and precipitation collecting modular assembly 100 (FIGS. 6 and 7) having left-hand and right-hand tower modules 102 and 104. As best illustrated in FIGS. 1-3, the left-hand tower module 102 includes a support tower module 110 having a base (or support foot) 112 with a width sufficiently narrow to fit between the left and right wheels of a motor vehicle. Alternatively, base 112 can have a width such that the wheels of the motor vehicle can rest on the top surface of the base (not shown). The support tower module 110 also includes a vertical pedestal 118 and a solar power mount 130. The vertical pedestal 118 has a bottom end affixed to one end of the base 112. The solar panel mount 130 has one end thereof affixed to a top end of the pedestal 118 and is cantilevered over the base. The solar panel mount 130 is sized to shelter a motor vehicle thereunder with sufficient additional space to permit individuals to enter and egress the vehicle.

The solar panel mount 130 has a solar panel mounting surface 132 extending about the periphery thereof wherein the solar panel mounting surface 132 is substantially planar. A central portion 134 is formed as a concave surface and defines at a low point thereof a drain hole 136 to facilitate the removal of rainwater, melted snow, etc. The solar panel mount 130 further includes at one edge flanking the pedestal 118 a downwardly depending tongue 144 extending the length of the solar panel mount 130. A receiver 140 is mounted to an opposite edge of the solar panel mount 130 and defines a groove 142 extending the length thereof. The groove 142 is shaped and positioned to receive the tongue 144 of a like configured support module 110. As illustrated, the tongue 144 is configured as a downwardly depending wedge with a concurrently shaped groove 142 in the receiver 140 to simplify the alignment of adjacent support modules 110. However, other configuration shapes for the tongue 144 and the groove 142 are contemplated herein, but are not illustrated. The tongue 144 and the receiver 140 each define an interlock hole 146 therethrough such that interlock holes 146 are axially aligned one with the other.

The pedestal 118 includes at least one and most preferably two fixed interlock pins 120 extending from a side opposite the base 112 and most preferably in vertical alignment one with the other. The fixed interlock pins 120 can include an interlock tab 122 extending downwardly at an end thereof. The pedestal 118 also defines a keyed interlock hole 124 therethrough which further defines a key slot 125.

Figure 5:
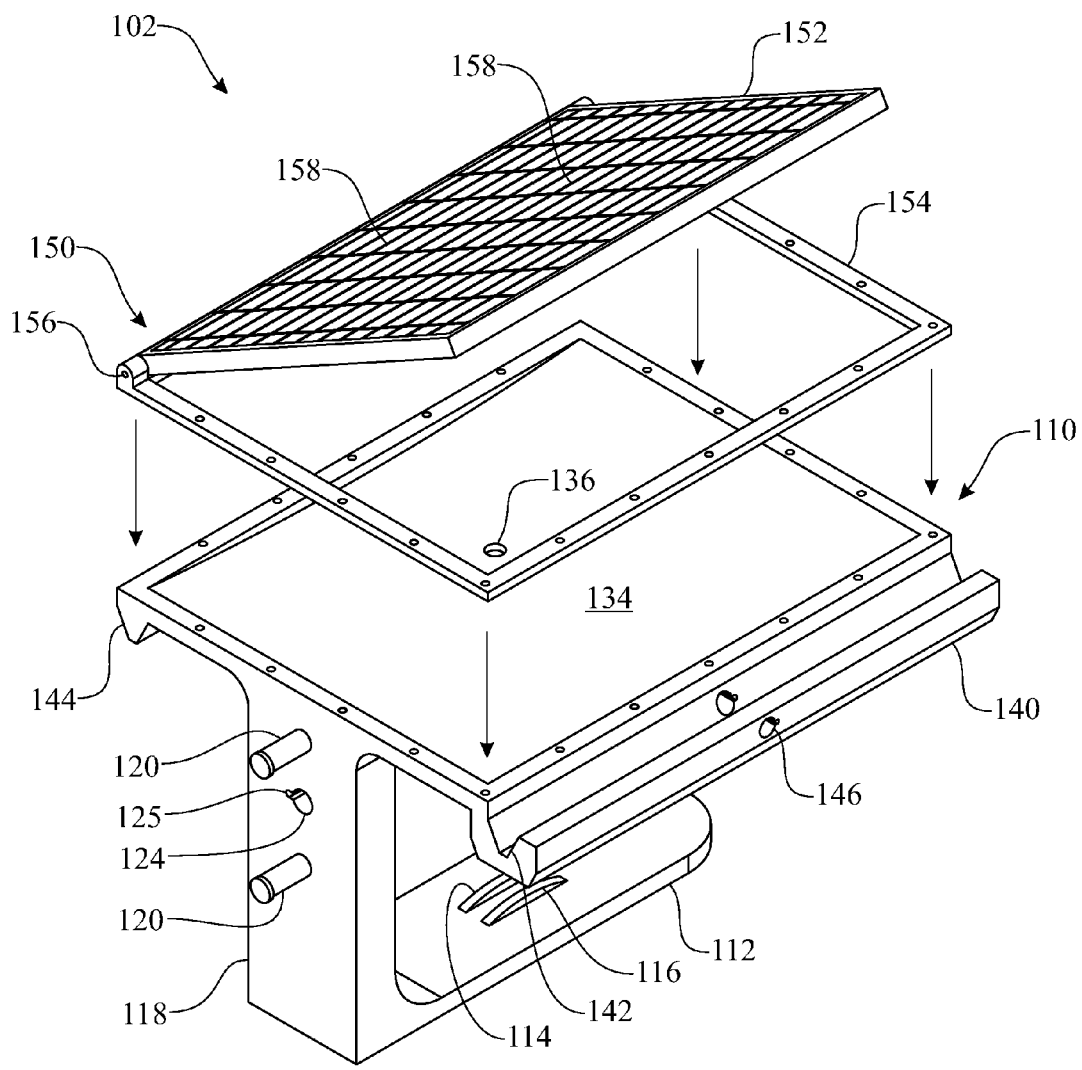
FIG. 5 presents a top rear perspective view of a left-hand tower module.
Figure 6:
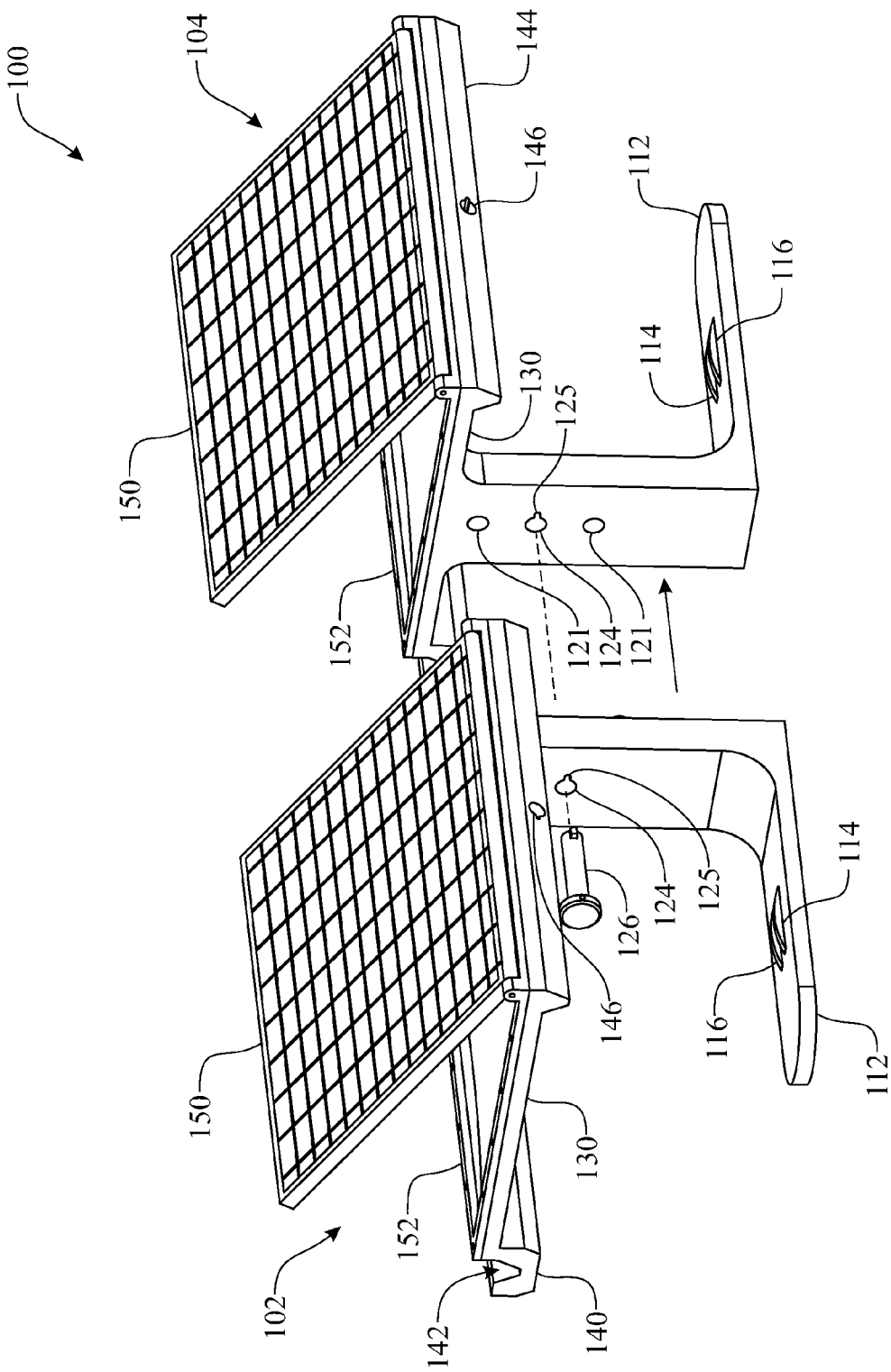
FIG. 6 presents a partially exploded front perspective view of a tower module assembly embodying the present invention wherein a left-hand tower module is mated to a right-hand tower module.
Figure 7:
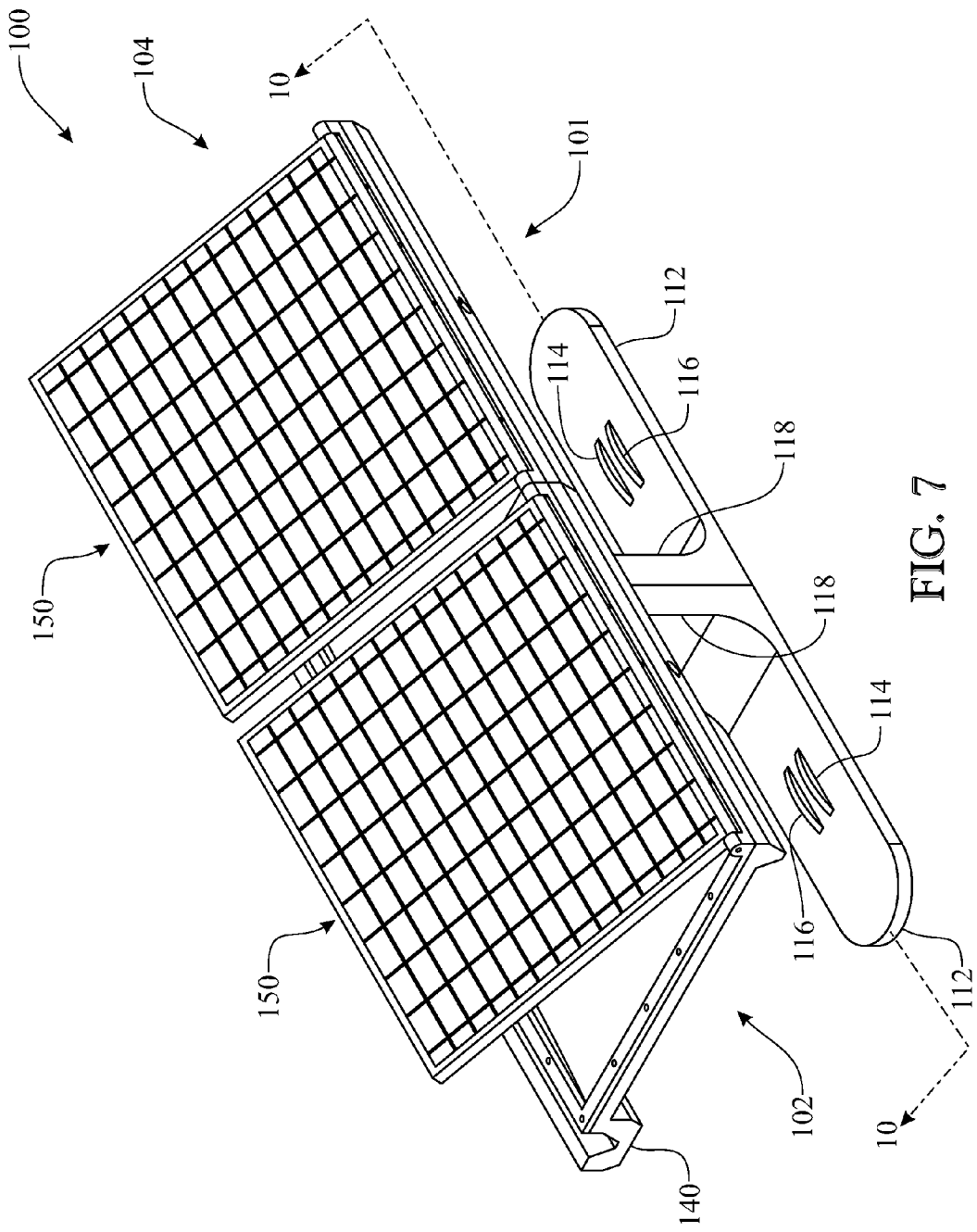
FIG. 7 presents a top left-hand perspective view of the assembled modular tower assembly.
Figure 8:
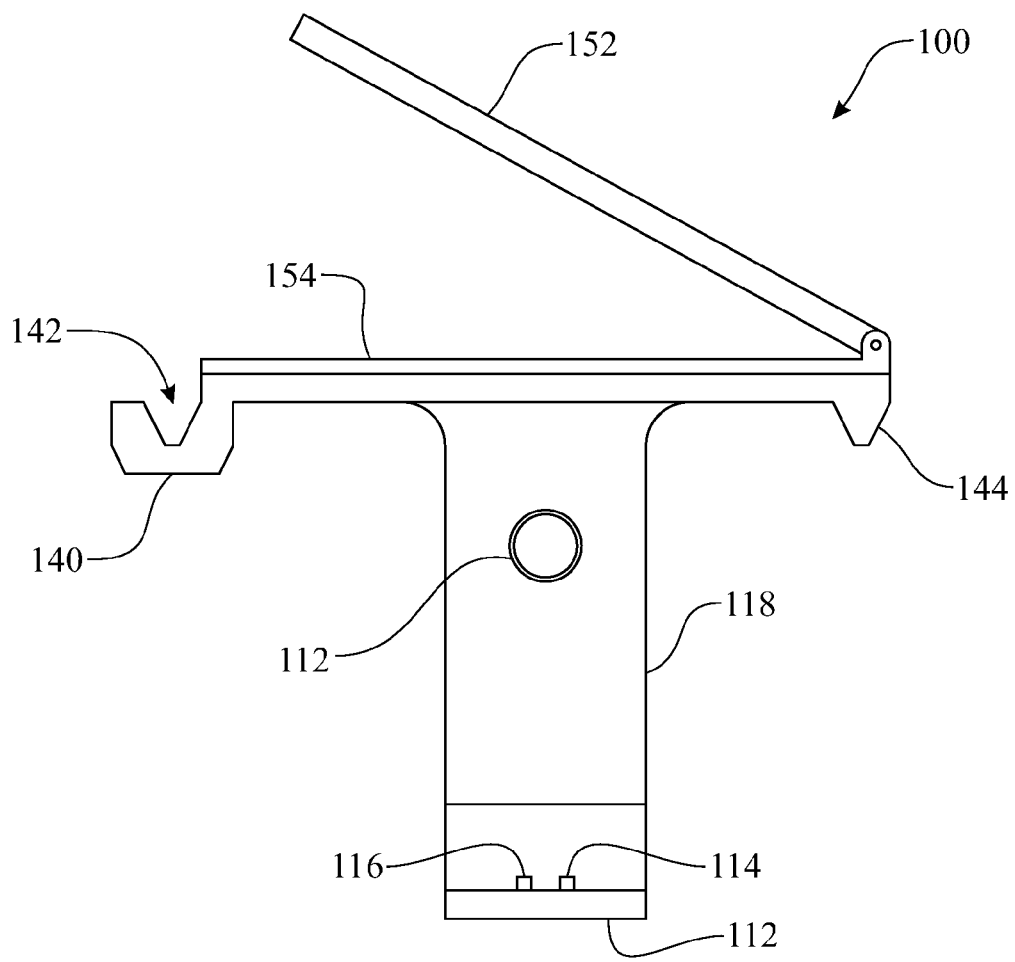
FIG. 8 presents a left elevation view of the assembled modular tower assembly.

Referring now to FIGS. 5-7 the left-hand tower module 102 further includes a solar panel assembly 150 which includes a solar array 152 attached to a mounting frame 154 with a hinge 156 at one edge thereof. The solar array 152 comprises a plurality of solar cells 158 for converting sunlight to electricity in a manner known in the art. The mounting frame 154 is sized to mate with the solar panel mounting surface 132 on the solar panel mount 130 of the support module 110. The manner of mounting thereof can be facilitated in any of a plurality of known mounting methods, all of which are contemplated herein. The solar array 152 is selectively pivotal to an angular orientation between a horizontal orientation and a vertical orientation to optimize maximum absorption of solar energy. While the primary purpose and function of the present invention is to provide large-scale commercial power generation to a local power grid 210 (FIG. 17), as an option, each solar array 152 may be operationally interconnected with electrical contacts 114, 116 for the optional delivery of electric power to a vehicle parked therein.

Figure 4:
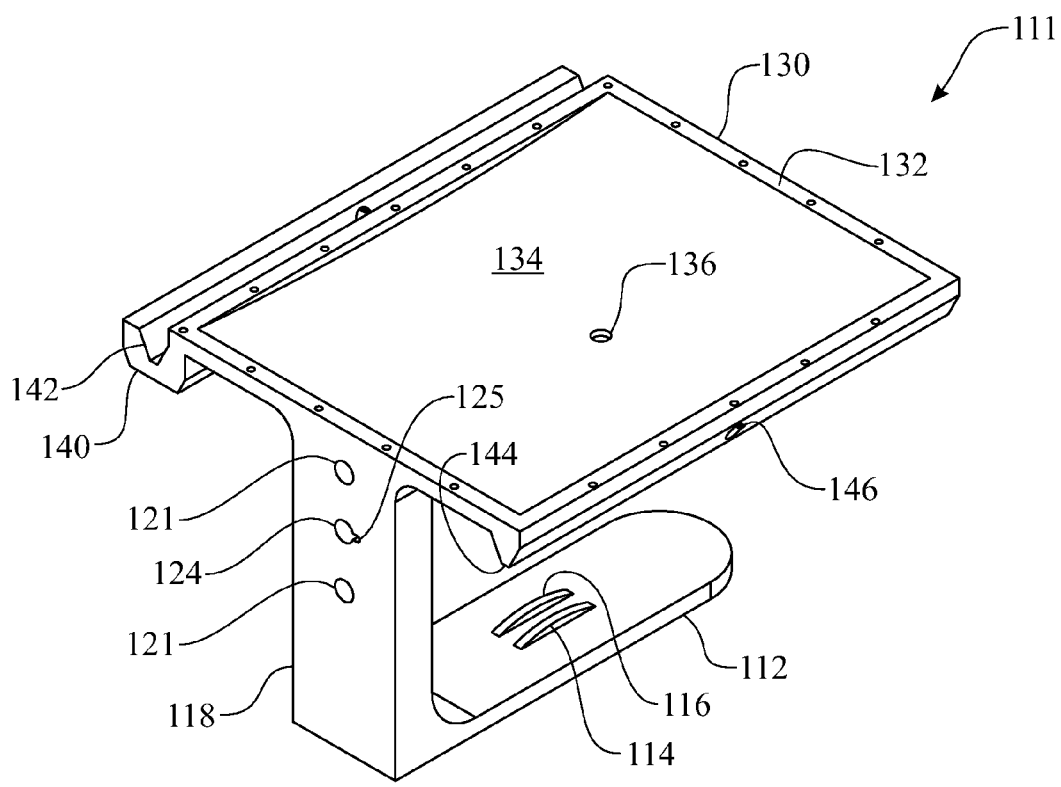
FIG. 4 presents a top rear perspective view of a right-hand module of a portable interlocking solar energy and precipitation collection tower assembly in accordance with an implementation of the present invention.

Referring to FIGS. 4 and 6, it can be seen that the right-hand tower module 104 is substantially similar to the left-hand tower module 102. The right-hand tower module 104 includes, as illustrated in FIG. 4, a support module 111 having a base 112, a pedestal 118, and a solar panel mount 130 substantially as described above. The solar panel mount 130 includes a tongue 144 depending from one edge thereof and at and opposite edge includes a receiver 140 defining a groove 142. However, the tongue 144 and the receiver 140 are positioned on opposite edges from the left-hand support module of FIG. 1. Further, the pedestal 118 defines interlock holes 121 in an equal number and position to the fixed interlock pins 120 of the support module 110. As seen in FIG. 6, the right-hand tower module 104 also includes the solar panel assembly 150 mounted to the solar panel mount 130.

Referring now to FIGS. 6-10, the tower module assembly 100 includes a left-hand tower module 102 and a right-hand tower module 104, which are arranged such that the pedestal of the left-hand module is joined to the pedestal of the right-hand module and wherein the respective bases 112 extend oppositely one from the other. The fixed interlock pins 120 of the left-hand tower module 102 are received in the holes 121 of the right-hand tower module 104 such that the respective pedestals 118 abut one another and are aligned therewith. As best visualized in FIG. 10, the interlock tabs 122 of the fixed interlock pins 120 engage the pedestal 118 of the right-hand tower module 111.

Figure 9:
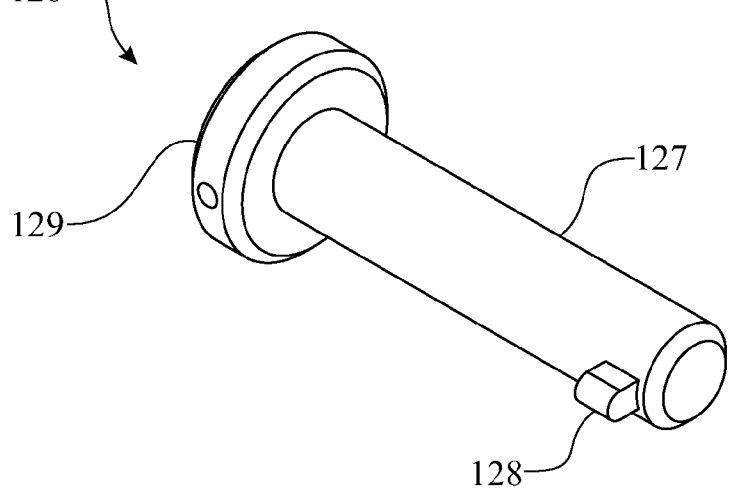
FIG. 9 presents a top perspective view of an interlock pin for securing the left-hand support module to the right hand support module.
Figure 10:
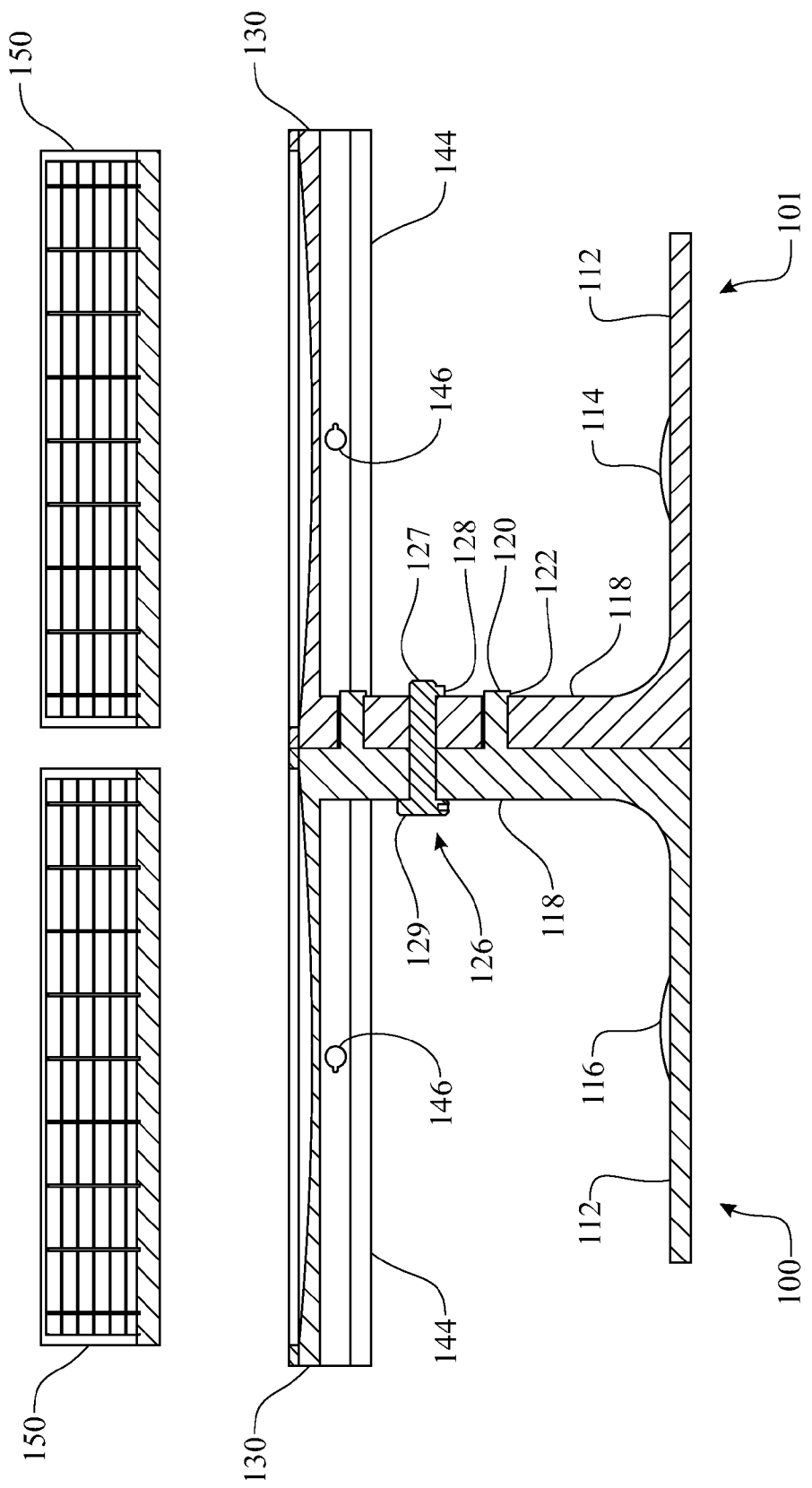
FIG. 10 presents a cross-sectional elevation view of the modular tower assembly shown in FIG. 7 and taken along the line 10-10, FIG. 7.

As illustrated in FIG. 9 an interlock pin 126 has a pin shank 127, a pin key 128 at one end thereof, and a pin head 129 at an opposite end thereof. The interlock pin 126 is received in the interlock hole 124 in the respective pedestals 118, and oriented such that the pin key 128 of the interlock pin 126 is received in the key slot 125 of the interlock hole 124. Once fully inserted and as best visualized in FIG. 10, the interlock pin 126 is rotated to lock the left-hand tower module 102 to the right-hand tower module 104.

Figure 14:
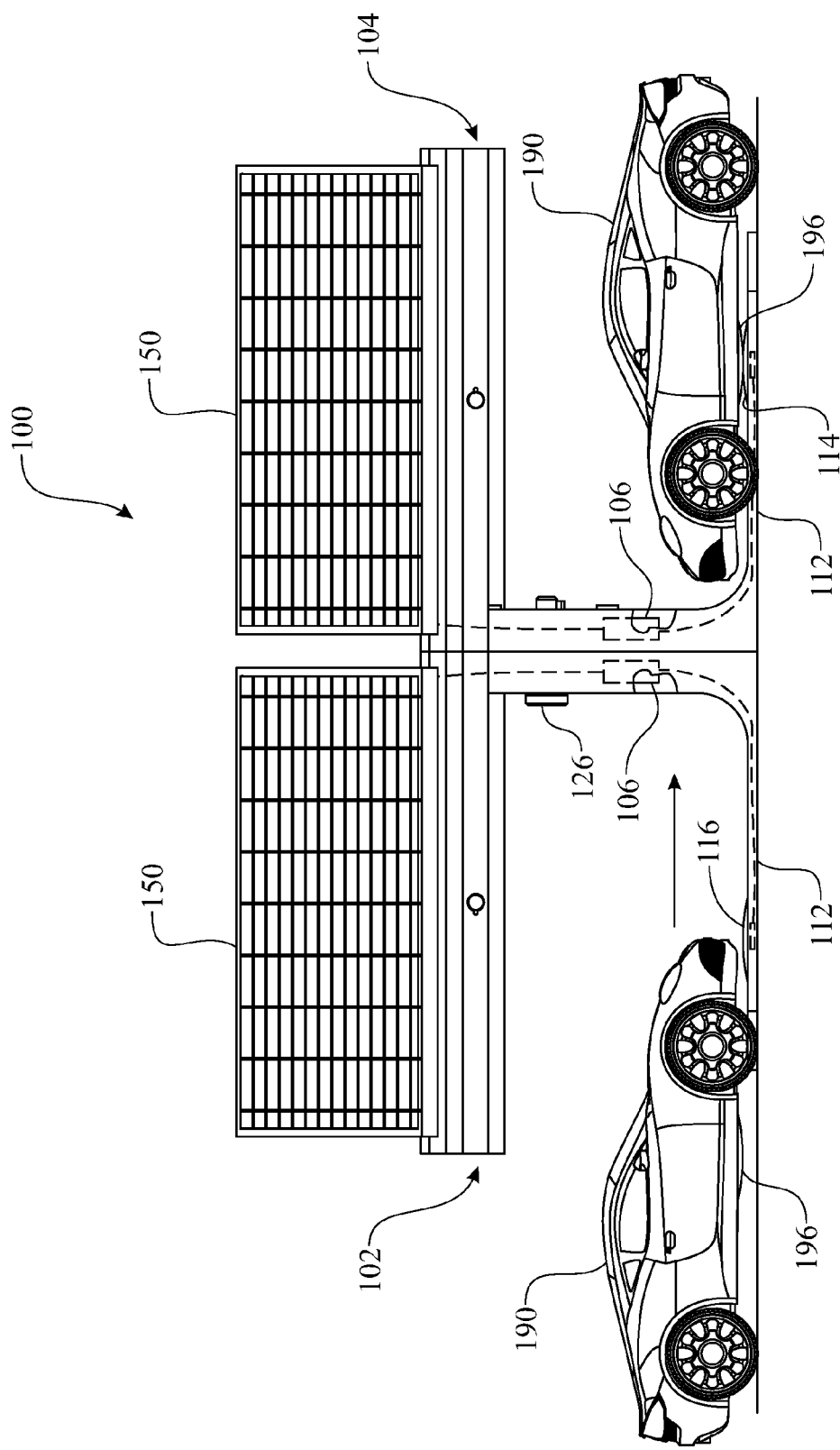
FIG. 14 presents an elevation view of a modular tower assembly illustrating an optional interface for using some of the energy collected by the tower module to charge an electric vehicle parked beneath the modular tower.

In use, and as illustrated in FIG. 14, a tower module assembly 100 is positioned for use. A motor vehicle 190 is illustrated on the left-hand side as approaching the tower assembly 100. Again, while it is clear that the primary function of the present invention is to collect solar energy for direct transfer to a neighboring utility grid (as further described below), as an optional side benefit of the novel tower structure, the wheels of an electrical vehicle 190 could centrally straddle the base 112 of the left-hand tower module 102 to align charging terminals 196 on the underside of the vehicle 190 with optional electrical contacts 114, 116 on the base 112. In that case, the vehicle 190 continues progressing forward until the vehicle charging terminals 196 have engaged electrical contacts 114, 116 on the base 112 as illustrated on the right-hand side of FIG. 14 wherein the vehicle 190 is parked. In this optional aspect, the left-hand and right-hand tower modules 102, 104 may include an electrical storage unit 106 interconnected with the solar panel assembly 150 and electrical contacts 114, 116 for storage of electrical power generated when there is no vehicle engaged with the electrical contacts 114, 116.

Figure 11:
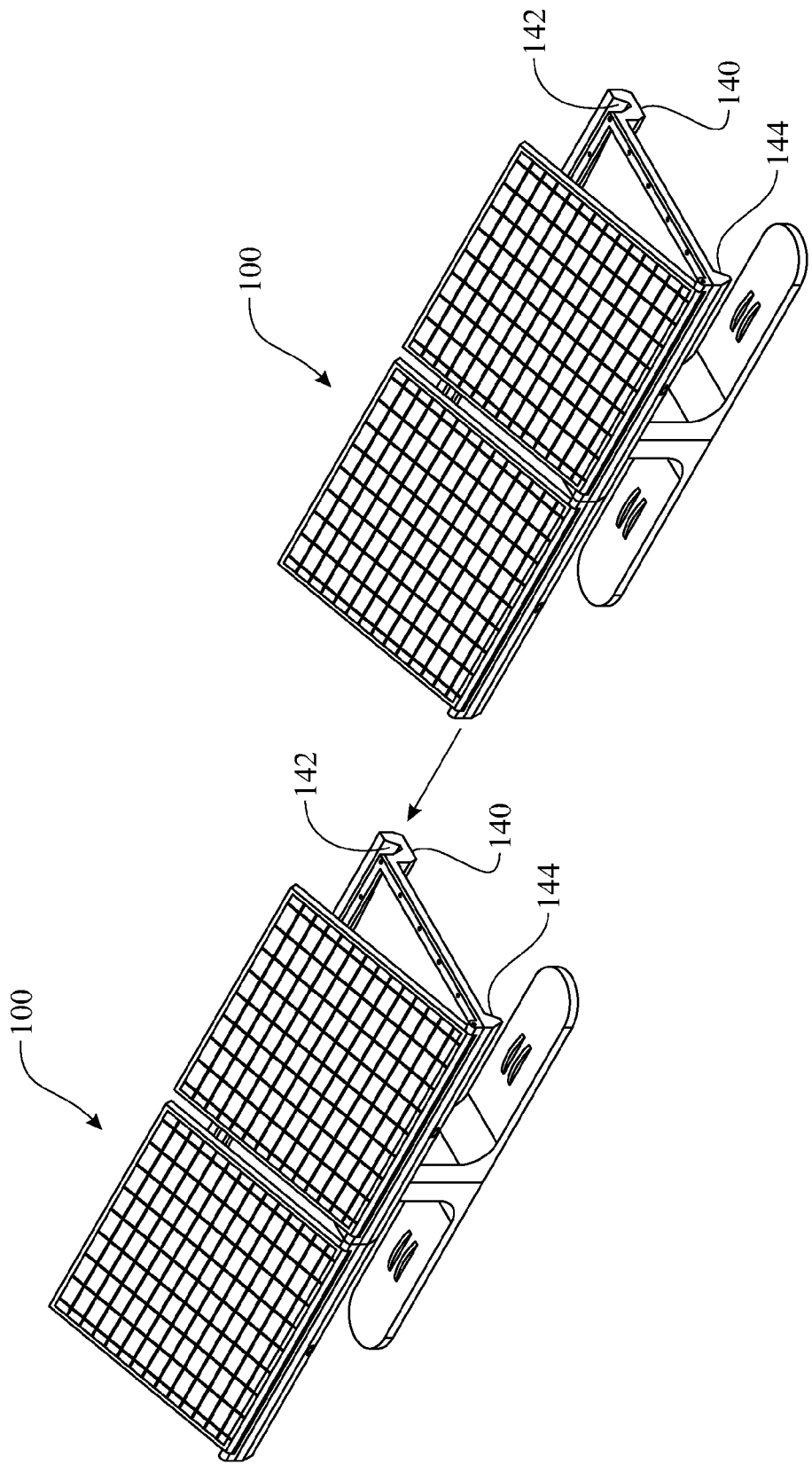
FIG. 11 presents a partially exploded top perspective view of two modular towers for mating one to the other.
Figure 12:
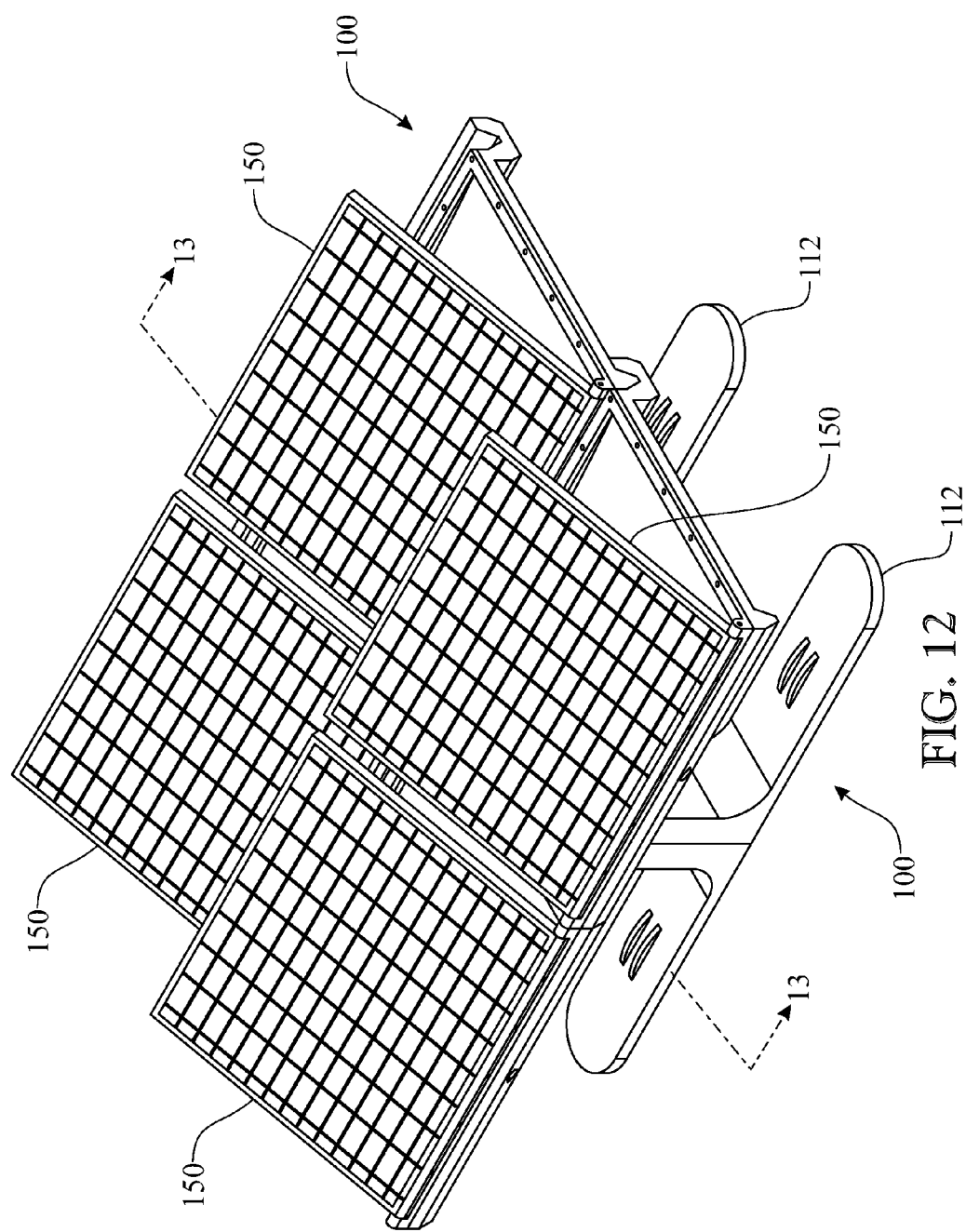
FIG. 12 presents a top perspective view of the two modular towers shown in FIG. 11 mated one to the other.
Figure 13:
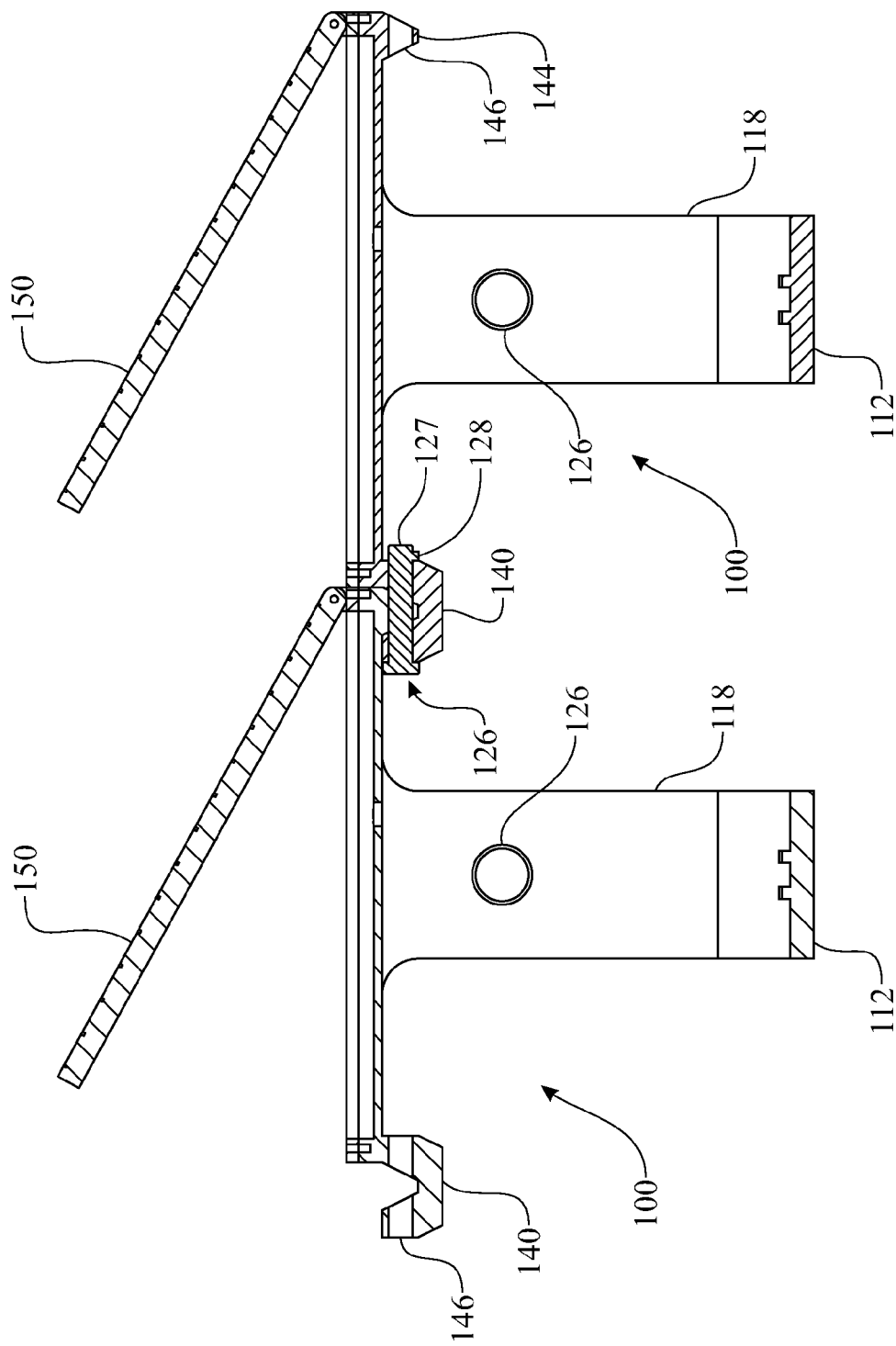
FIG. 13 presents a cross-sectional elevation view of the mated modular towers shown in FIG. 12 and taken along the line 13-13, FIG. 12.

Referring now to FIGS. 11-13, two or more tower module assemblies 100 can be ganged together in a laterally progressing sequence wherein the tongue 144 of a first modular tower assembly 100 is received in the groove 142 of a second modular tower assembly 100. To secure the laterally adjacent modular tower assemblies 100 one to the other, the interlock holes 146 of the engaged tongue 144 in the groove 142 of the receiver 140 of the inter joined modular tower assemblies 100 are aligned. An interlock pin 126 is inserted through the interlock holes 146 and rotated such that the pin key 128 locks the pin 126 in place in the manner as described above.

Figure 15:
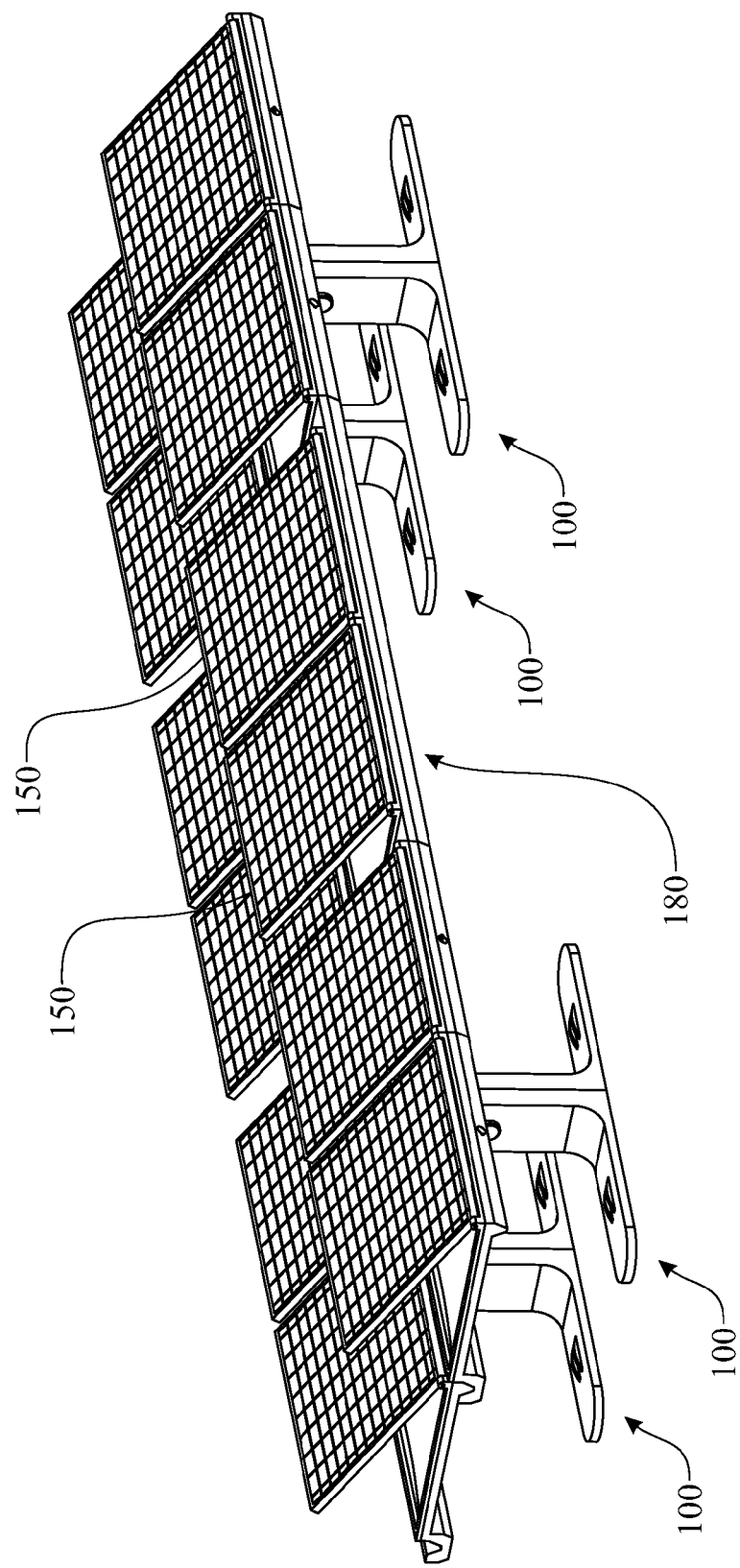
FIG. 15 presents a plurality of modular tower assemblies wherein an auxiliary solar assembly interconnects and extends between a right end of a first modular tower and a left end of a second modular tower.
Figure 16:
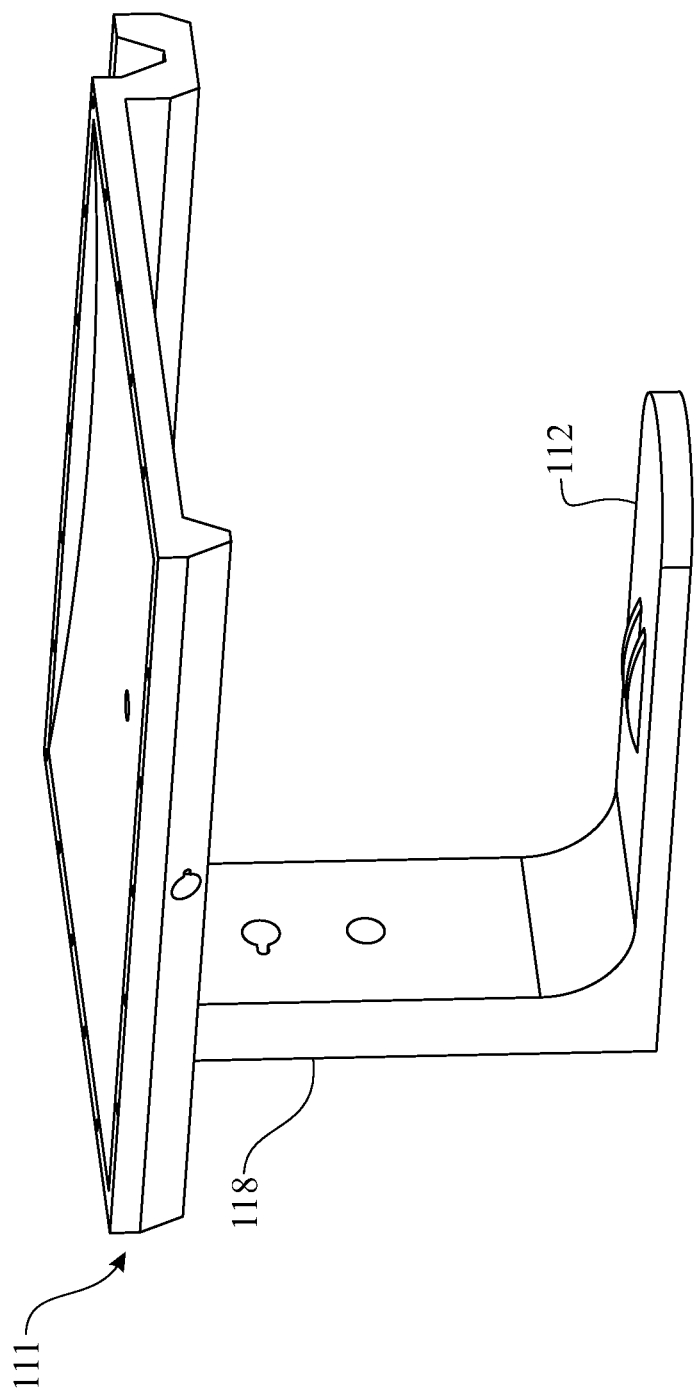
FIG. 16 presents a top right perspective view of a right-hand modular tower including optional features mounted thereto.

In yet another configuration as illustrated in FIG. 15, two modular tower assemblies 100 can be arranged in-line and separated one from the other wherein a solar panel bridge 180 has one end thereof affixed to the free cantilevered end of a first modular tower assembly 100 and an opposite end thereof affixed to the free cantilevered end of a second modular tower assembly 100. The solar panel bridge 180 includes one or more solar panel assemblies 150 attached to a top thereof and electrically interconnected with the modular tower assemblies 100. The solar panel bridge 180 further includes a tongue such as tongue 144 and a groove such as groove 142 such that when interconnected with the modular tower assemblies 100 there is a continuous tongue along one edge thereof and a continuous groove along an opposite edge thereof. Again, interconnected modular tower assemblies 100 and solar panel bridge 180 can be ganged together to provide plurality of modular towers and a drive area beneath the solar panel bridge 180. This configuration is particularly useful for large parking areas.

Alternatively, a left-hand modular tower 102 and a right-hand modular tower 104 can be separated one from the other and oriented such that a free cantilevered end of each solar panel mount of the respective modules 102, 104 are facing one to the other. A solar panel bridge 180 has one end thereof affixed to the free cantilevered end of the left-hand module 102 and an opposite end thereof affixed to the free cantilevered end of the right-hand module 104. This configuration provides additional solar panel assemblies for the generation of additional electrical power. Also, this configuration can be laterally ganged together with other like assembled modules 102, 104 and solar panel bridges 180 to provide additional power.

Figure 17:
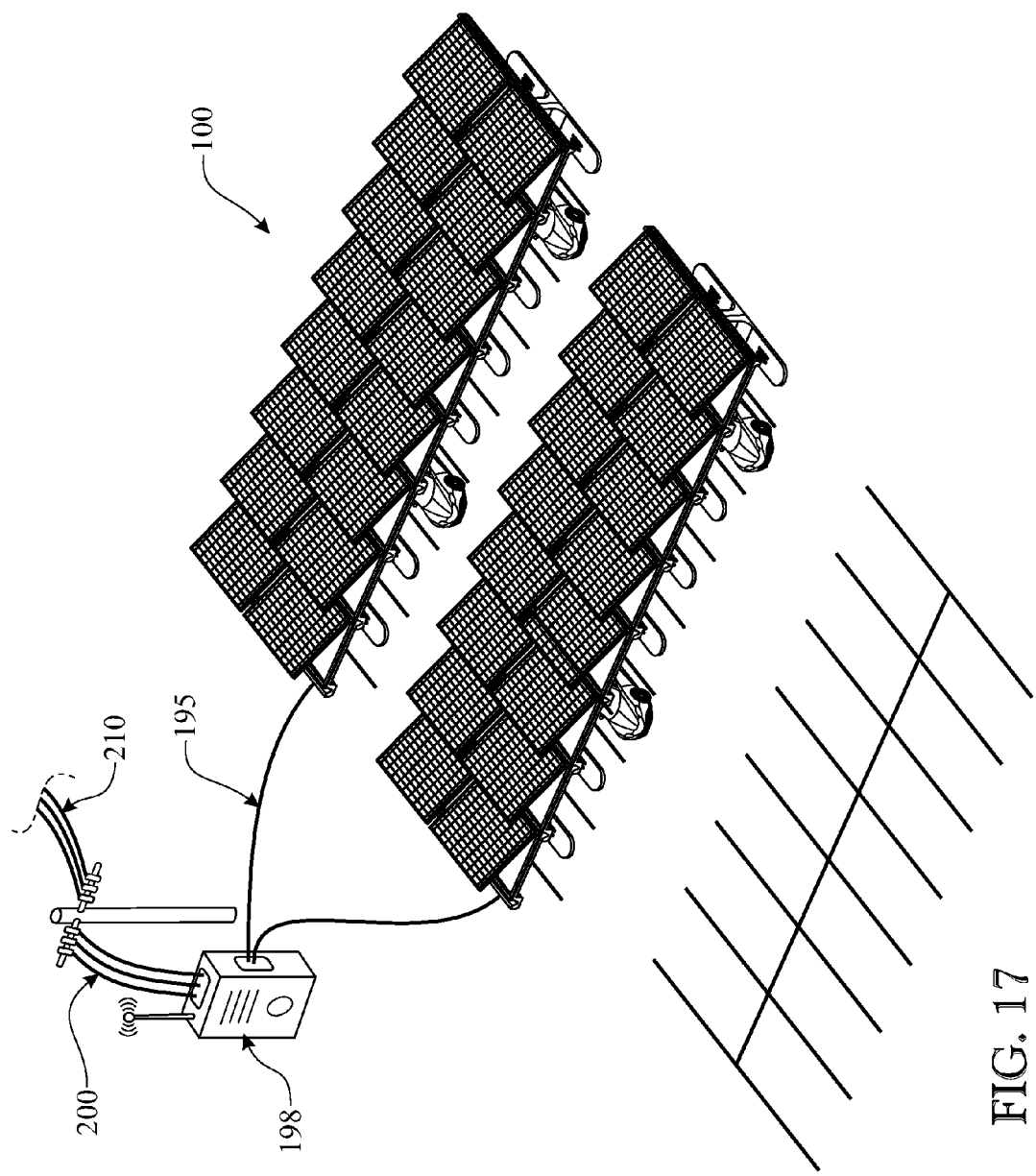
FIG. 17 presents a top right perspective view of the portable interlocking modular tower system of the present invention connected to a local power grid.

Referring now primarily, to FIG. 17, as previously stated the primary benefit of the portable tower module assembly of the present invention is that it provides a grid-connected photovoltaic power system, whereby energized photovoltaic (PV) panels are connected, for example by power lines 195, to the utility grid 210. Grid-connected PV power systems consist of PV panels, Maximum Power Point Tracking (MPPT), solar inverters, power conditioning units and grid connection equipment (generally referred to in FIG. 17 as reference numeral 198). Photovoltaic (PV) modules are a packaged, connected assembly of solar cells, which are electrically connected and mounted on a supporting structure to create a solar panel. When conditions are right, the grid-connected PV system supplies excess power, beyond consumption by the connected load, to the utility grid. Solar energy gathered by PV solar panels, intended for delivery to a power grid, must be conditioned, or processed for use, by a grid-connected inverter. The inverter sits between the solar array and the grid, draws energy from each, and may be a large stand-alone unit or may be a collection of small inverters, each physically attached to individual solar panels.

Since many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. A combination solar collection and precipitation collection modular assembly for deployment upon a parking lot ground surface, the modular assembly comprising:
   a left-hand support module, comprising:
      a vertically-oriented pedestal portion having an upper end, a lower end, a left-facing surface and an opposite right-facing surface, said right-facing surface having at least one interlocking pin extending outwardly therefrom and a keyed interlock aperture extending therethrough;
      a horizontally-oriented support foot having an upper surface, a lower surface, a proximal end portion and a distal end, said pedestal portion lower end transitioning into said proximal end of said support foot;
      a solar panel mounting and precipitation collection portion having a periphery surrounding a concave upper surface, said concave upper surface having a precipitation drainage aperture extending therethrough, said pedestal portion upper end transitioning into said solar panel mounting and precipitation collection portion, said solar panel mounting and precipitation collection portion extending outwardly in a cantilevered manner over said support foot; and
      a solar panel assembly mounted atop said support module solar panel mounting and precipitation collection portion;
   a right-hand support module, comprising:
      a vertically-oriented pedestal portion having an upper end, a lower end, a left-facing surface and an opposite right-facing surface, said left-facing surface having at least one interlocking pin receiving aperture sized and shaped for engagement with the said corresponding at least on interlocking pin of said left-hand support module, and a keyed interlock aperture extending therethrough;
      a horizontally-oriented support foot having an upper surface, a lower surface, a proximal end portion and a distal end, said pedestal portion lower end transitioning into said proximal end portion of said support foot;
      a solar panel mounting and precipitation collection portion having a periphery surrounding a concave upper surface, said concave upper surface having a precipitation drainage aperture extending therethrough, said pedestal portion upper end transitioning into said solar panel mounting and precipitation collection portion, said solar panel mounting and precipitation collection portion extending outwardly in a cantilevered manner over said support foot; and
      a solar panel assembly mounted atop said support module solar panel mounting and precipitation collection portion.

2. A modular assembly according to claim 1 wherein said solar panel mounting and precipitation collection portion is sized to shelter a motor vehicle thereunder.

3. A modular assembly according to claim 1 wherein said solar panel mounting and precipitation collection portion includes a tongue positioned along an edge flanking said support pedestal and further includes a receiver defining a groove in an opposite edge thereof, said groove configured to receive a tongue of a like configured solar panel mounting and precipitation collection portion of an adjacent support module.

4. A modular assembly according to claim 1 wherein each said solar panel assembly includes a mounting frame affixed to said solar panel mounting and precipitation collection portion of each said support module and further wherein said solar panel assembly includes a solar array pivotally affixed to said mounting frame.

5. A modular assembly according to claim 4 wherein said solar array is selectively pivotal to an angular orientation between a horizontal orientation and a vertical orientation.

6. A modular assembly according to claim 1 wherein said pedestal of said left-hand support module includes at least one fixed interlock pin extending oppositely from said base and intermediate to said pedestal top and said pedestal bottom, and further wherein said pedestal of said right-hand support module defines a hole therein for receiving said at least one fixed interlock pin for aligning said left-hand and said right-hand support modules one to the other.

7. A modular assembly according to claim 1 wherein said left-hand pedestal and said right-hand pedestal each define an interlock hole, one in alignment with the other, said interlock holes further defining a key slot therein, and further including an interlock pin extending through said interlock holes, said interlock pin having a key at an end opposite a head thereof for engaging one of said pedestals for locking said left-hand pedestal to said right-hand pedestal.

8. A modular tower assembly for collecting solar power for transfer to a power grid, the tower assembly comprising:
 a first support module and a second like configured support module, each said support module having:
  a base;
  a support pedestal having a bottom thereof affixed to one end of said base; and
  a solar panel mount sized to receive a motor vehicle thereunder having one end thereof affixed to a top of said pedestal and cantilevered over said base, said solar panel mount further including a tongue positioned along an edge flanking said support pedestal and further including a receiver at an opposite edge thereof,
 said receiver defining a groove therein parallel to said tongue;
 a solar panel assembly affixed to said solar panel mount of said first support module; and
 a solar panel assembly affixed to said solar panel mount of said second support module;
 wherein said tongue of said solar panel mount of said first support module is received in said groove of said solar panel mount of said second support module thereby affixing said first support module to said second support module; and
 wherein said tongue of said solar panel mount of said first support module and said receiver of said second support module define an interlock hole therethrough, and further including an interlock pin engaged in said interlock hole to secure said tongue in said groove.

9. A modular tower assembly for collecting solar power for transfer to a power grid, the tower assembly comprising:
 a first support module and a second like configured support module, each said support module having:
  a base;
  a support pedestal having a bottom thereof affixed to one end of said base; and
  a solar panel mount sized to receive a motor vehicle thereunder having one end thereof affixed to a top of said pedestal and cantilevered over said base, said solar panel mount further including a tongue positioned along an edge flanking said support pedestal and further including a receiver at an opposite edge thereof, said receiver defining a groove therein parallel to said tongue;
 a solar panel assembly affixed to said solar panel mount of said first support module; and
 a solar panel assembly affixed to said solar panel mount of said second support module;
 wherein said tongue of said solar panel mount of said first support module is received in said groove of said solar panel mount of said second support module thereby affixing said first support module to said second support module; and
 wherein each said solar panel assembly includes a mounting frame affixed to said solar panel mount of each said support module and further wherein said solar panel assembly includes a solar array pivotally affixed to said mounting frame.

10. A modular tower assembly according to claim 9 wherein said solar array is selectively pivotal to an angular orientation between a horizontal orientation and a vertical orientation.

11. A solar collection modular assembly for deployment upon a parking lot ground surface, the modular assembly comprising:
 a left-hand support module, comprising:
  a vertically-oriented pedestal portion having an upper end, a lower end, a left-facing surface and an opposite right-facing surface, said right-facing surface having at least one interlocking pin extending outwardly therefrom and a keyed interlock aperture extending therethrough;
  a horizontally-oriented support foot having an upper surface, a lower surface, a proximal end portion and a distal end, said pedestal portion lower end transitioning into said proximal end of said support foot;
  a solar panel mounting portion, said pedestal portion upper end transitioning into said solar panel mounting portion, said solar panel mounting portion extending outwardly in a cantilevered manner over said support foot; and
  a solar panel assembly mounted atop said support module solar panel mounting portion;
 a right-hand support module, comprising:
  a vertically-oriented pedestal portion having an upper end, a lower end, a left-facing surface and an opposite right-facing surface, said left-facing surface having at least one interlocking pin receiving aperture sized and shaped for engagement with the said corresponding at least on interlocking pin of said left-hand support module, and a keyed interlock aperture extending therethrough;
  a horizontally-oriented support foot having an upper surface, a lower surface, a proximal end portion and a distal end, said pedestal portion lower end transitioning into said proximal end portion of said support foot;
  a solar panel mounting portion, said pedestal portion upper end transitioning into said solar panel mounting portion, said solar panel mounting portion extending outwardly in a cantilevered manner over said support foot; and
  a solar panel assembly mounted atop said support module solar panel mounting portion.

12. A modular assembly according to claim 11 wherein said solar panel mounting portion is sized to shelter a motor vehicle thereunder.

13. A modular assembly according to claim 11 wherein said solar panel mounting portion includes a tongue positioned along an edge flanking said support pedestal and further includes a receiver defining a groove in an opposite edge thereof, said groove configured to receive a tongue of a like configured solar panel mounting portion of an adjacent support module.

14. A modular assembly according to claim 11 wherein each said solar panel assembly includes a mounting frame affixed to said solar panel mounting portion of each said support module and further wherein said solar panel assembly includes a solar array pivotally affixed to said mounting frame.

15. A modular assembly according to claim 14 wherein said solar array is selectively pivotal to an angular orientation between a horizontal orientation and a vertical orientation.

16. A modular assembly according to claim 11 wherein said pedestal of said left-hand support module includes at least one fixed interlock pin extending oppositely from said base and intermediate to said pedestal top and said pedestal bottom, and further wherein said pedestal of said right-hand support module defines a hole therein for receiving said at least one fixed interlock pin for aligning said left-hand and said right-hand support modules one to the other.

17. A modular assembly according to claim 11 wherein said left-hand pedestal and said right-hand pedestal each define an interlock hole, one in alignment with the other, said interlock holes further defining a key slot therein, and further including an interlock pin extending through said interlock holes, said interlock pin having a key at an end opposite a head thereof for engaging one of said pedestals for locking said left-hand pedestal to said right-hand pedestal.

* * * * *